(12) United States Patent
Tuymer et al.

(10) Patent No.: US 7,455,755 B2
(45) Date of Patent: Nov. 25, 2008

(54) VACUUM PLASMA GENERATOR

(75) Inventors: Gerhard Tuymer, Bad Schallerbach (AT); Jürgen Ramm, Maienfeld (CH); Daniel Lendi, Grabs (CH)

(73) Assignee: Oerlikon Trading AG, Trubbach, Trubbach (CH)

( * ) Notice: Subject to any disclaimer, the term of this patent is extended or adjusted under 35 U.S.C. 154(b) by 0 days.

(21) Appl. No.: 11/817,443

(22) PCT Filed: Mar. 20, 2006

(86) PCT No.: PCT/CH2006/000124

§ 371 (c)(1),
(2), (4) Date: Aug. 30, 2007

(87) PCT Pub. No.: WO2006/099759

PCT Pub. Date: Sep. 28, 2006

(65) Prior Publication Data

US 2008/0143260 A1 Jun. 19, 2008

(30) Foreign Application Priority Data

Mar. 24, 2005 (CH) .................................... 0518/05
Aug. 3, 2005 (CH) .................................... 1290/05

(51) Int. Cl.
*C23C 14/00* (2006.01)

(52) U.S. Cl. ............................ 204/298.08; 204/192.12; 204/298.23; 363/124; 363/125; 315/111.21; 315/247; 315/282

(58) Field of Classification Search ............ 204/192.12, 204/192.15, 298.08, 298.23; 363/21.04, 363/21.06, 21.1, 21.14, 108, 89, 97, 98, 124, 363/125; 315/111.21, 247, 276, 282, 291; 438/710
See application file for complete search history.

(56) References Cited

U.S. PATENT DOCUMENTS

| | | | | | |
|---|---|---|---|---|---|
| 5,015,493 | A | * | 5/1991 | Gruen | 427/571 |
| 5,303,139 | A | * | 4/1994 | Mark | 363/63 |
| 5,993,613 | A | * | 11/1999 | Manley | 204/192.12 |
| 6,256,214 | B1 | * | 7/2001 | Farrington et al. | 363/127 |
| 6,296,742 | B1 | * | 10/2001 | Kouznetsov | 204/192.12 |
| 2005/0098430 | A1 | * | 5/2005 | Tuymer et al. | 204/298.08 |

* cited by examiner

*Primary Examiner*—Haissa Philogene
(74) *Attorney, Agent, or Firm*—Notaro & Michalos P.C.

(57) ABSTRACT

The invention relates to a vacuum plasma generator for providing a plasma discharge (10) for treating work pieces (5) by way of a pulsed plasma process in a vacuum chamber (2). Said vacuum plasma generator comprises a generator output (9, 9') having an AC mains supply (6a), an AC/DC mains rectifier system (6) for rectifying the AC mains voltage to a DC voltage, a filter capacitor (6b), a first stage as clocked DC/DC voltage converter (7) with means for adjusting the DC output voltage which produces an intermediate circuit voltage (Uz), comprising a controlled power switch (7a) which feeds the primary winding of a transformer (14) and the secondary winding of which is connected to a rectifier (15) and a downstream intermediate capacitor (12) and configures a floating transformer secondary circuit (23). Said secondary circuit is connected to a downstream second stage which is a pulse output stage (8) and is connected to the generator output (9, 9'). The DC/DC voltage converter (7) has at least two floating transformer secondary circuits (23) and comprises a switchover device (20) with a switch controller (22) for optionally switching the floating transformer secondary circuits (23) in parallel or in series.

19 Claims, 9 Drawing Sheets

VACUUM PLASMA GENERATOR

FIELD AND BACKGROUND OF THE INVENTION

The invention relates to a vacuum plasma generator for feeding a plasma discharge for the treatment of workpieces in a vacuum chamber.

Electrical feeder apparatus for operating gas discharges, or plasma discharges, for vacuum processes are known in a variety of manners. Such electrical feeder apparatus are technically also referred to as generators. It is here important to be able to control the operating conditions well and reliably, since the nature of plasma discharges and the plasma connected thereto, make special requirements of them. With such vacuum plasma processes today a multiplicity of different applications are covered, such as for example coating, cleaning, thermal treatment of workpieces and substrates, etc. Such plasma processes are, for example, cathode sputtering, spark evaporation, also referred to as arc evaporation, surface treatments through electron or ion bombardment and plasma CVD deposition methods. In order to be able to attain specific results in such plasma processes, the discharge processes must be mastered appropriately and controlled purposefully with the aid of suitable power supplies. The possible parameter field of the various operating modes of such plasma discharges is here very broad and it is possible to achieve novel and unexpected results, such as for example in the layer properties of coated workpieces. Attempts have therefore been made for some time to expand the parameter field additionally with plasma discharges fed pulsatingly in order to be able to realize new possibilities. Herein unipolar pulses or bipolar pulses are utilized at different frequencies, often in the range of kHz up to more than 100 kHz, and also with different pulse widths and/or pulse shapes. With this pulse technology it is possible to work, for example, with poorly conducting materials or even insulating layers without undesirable spark discharges occurring. In particular in the important application case of substrate bias, pulse technology leads to positive results. Here, as a rule, work took place with a voltage-stable pulsed current supply with which high currents can also be realized. For generating coatings it is also possible to feed using the pulse technique coating sources, for example sputtering sources or also spark evaporation sources.

Pulse technology is especially well suited for controlling processes, such as for example reactive processes, with materials that are poorly conducting or not at all. However, employing this technology also yields enormous advantages when using electrically well conducting materials in the process, such as for example for setting the stoichiometry of layers, the density of layer materials and also for exerting an influence on the structure.

Due to the diversity of feasibilities, work today takes place with the entire spectrum of known plasma discharge types or plasma operating modes.

In U.S. Pat. No. 5,303,139 a bipolar power supply is utilized, which describes extensive pulse plasma applications in the area of so-called glow discharges in the field of PVD and CVD applications. The glow discharges conventionally operate at voltages below 1000 V, thus at a few 100 V, and low current values. Such glow discharges are often additionally supported with specific magnet fields. Sources of this type have become known as magnetron sources. They are operated at a few 100 V and permit realizing higher discharge currents than the glow discharge without magnetic field support.

Abnormal glow discharges, such as are described for example in U.S. Pat. No. 5,015,493, are operated at higher voltages of a few kV and at higher current values than those of glow or magnetron discharges, however at lower current values compared to spark discharges.

Spark evaporators, also referred to as arc evaporators, are operated in the range of a few 10 V, however at very high currents of conventionally a few 100 A.

A further specific discharge form is disclosed in U.S. Pat. No. 6,296,742, the so-called "High Power Pulsed Sputtering".

This operating mode is sometimes also referred to as "diffused discharge", since a striking diffuse brightening of the plasma occurs in the target proximity. The discharge is herein operated with pulse voltages of 0.35 to 5 kV at pulse powers of 10 kW to 1 MW. The pulse lengths are in the range of 50 microseconds to 1 millisecond and the interval between the pulses is in the range from 10 milliseconds to 1000 seconds.

Said plasma processes or plasma treatment methods represent a load for the power supply, which cover a broad impedance range and, consequently, require feed voltages in the range of a few V up to the kV range and coil currents of a few A to a few 100 A at pulse frequencies from kHz to a few 100 kHz. Until now for each application range separate power supplies had to be utilized laid out according to the load or to the corresponding plasma operating mode. If a further voltage range is to be covered with conventional generators, the disadvantage is encountered that the nominal power of the generator must correspond to the product of maximal output voltage and maximal output current, and methods which require low voltages most often require higher currents than methods with high voltage, such that the nominal power would need to become unnecessarily large.

A further disadvantage of conventional generators employed over a wide output voltage range is the relative lowering of the quality when operating with low output voltage. For example, thereby the resolution is decreased at a simultaneous increase of the ripple. A further especially serious disadvantage comprises that the pulse form is often not stable and varies during the operating as a function of the load behavior and, in this case, especially the edge steepness of the pulses varies or even flattens and sufficiently steep pulses edges cannot be generated. With the plasma processes currently carried out for working workpiece surfaces, such as in particular for the deposition of layers, it should be possible to operate several of the plasma operating modes previously listed within the production process in the same vacuum process installation. This should be possible in individual plasma source configurations through the control of the operating mode and/or also in several different source configurations, which are specifically laid out for different operating modes, such as for example, and preferably, a combination of arc evaporators, sputter sources and bias plasma gaps.

SUMMARY OF THE INVENTION

The present invention addresses the problem of eliminating said disadvantages of prior art. The problem addressed is in particular to realize a vacuum plasma generator which covers a high load impedance range for feeding of at least two different plasma operating modes of said type. The generator should, moreover, permit high pulse powers in all operating modes and output a defined pulse behavior to the plasma in order to be able to realize the desired layer properties and do this at high economy.

The problem is solved according to the invention thereby that a vacuum plasma generator is implemented with a generator output for feeding a plasma discharge for the treatment of workpieces in a vacuum chamber with an AC voltage mains connection, a mains rectifier configuration for converting the mains AC voltage into a DC voltage, a smoothing capacitor, a first stage as clocked DC/DC voltage converter with means for setting the DC output voltage, which forms an intermediate circuit voltage comprising a controlled power switch, which feeds the primary winding of a transformer and whose secondary winding is connected to a rectifier and a succeeding intermediate circuit capacitor and forms a floating transformer secondary circuit, wherein the latter is connected with a succeeding second stage which forms a pulse output stage and is connected to the generator output, the DC-DC voltage converter comprising at least two floating transformer secondary circuits and including a change-over device with a switching control for the optional parallel connection or serial connection of the floating transformer secondary circuit.

Via the up-stream DC-DC voltage converter, the voltage which is fed into the second stage can be adjusted over a wide range. The DC-DC converter is clocked and implemented as a switched mode power supply, for example as a buck-boost converter. The adjusted output voltage can in this case be lower as well as also higher than the input voltage. With the change-over device floating transformer secondary circuits can be connected in series or parallel. It becomes hereby possible to expand considerably the operating range for feeding the pulse output stage and to adapt in a wide range to different plasma impedance zones. With an increase of the number of transformer secondary circuits in the first stage with the associated change-over devices, the voltage range can be expanded corresponding to the desired application range. The pulse output stage which feeds the plasma gap, can consequently be controlled and always be operated in the optimal operating range, such that the pulse form is retained even at high load according to the allowed requirements and does not become deformed or even collapses unchecked.

The various features of novelty which characterize the invention are pointed out with particularity in the claims annexed to and forming a part of this disclosure and are entirely based on the Switzerland priority application no. 518/05, filed Mar. 24, 2005, and Switzerland priority application no. 1290/05, filed Aug. 3, 2005.

BRIEF DESCRIPTION OF THE DRAWINGS

In the following the invention will be explained in further detail by example and in conjunction with schematic Figures. Therein depict.

DETAILED DESCRIPTION OF THE INVENTION

Figure 1:
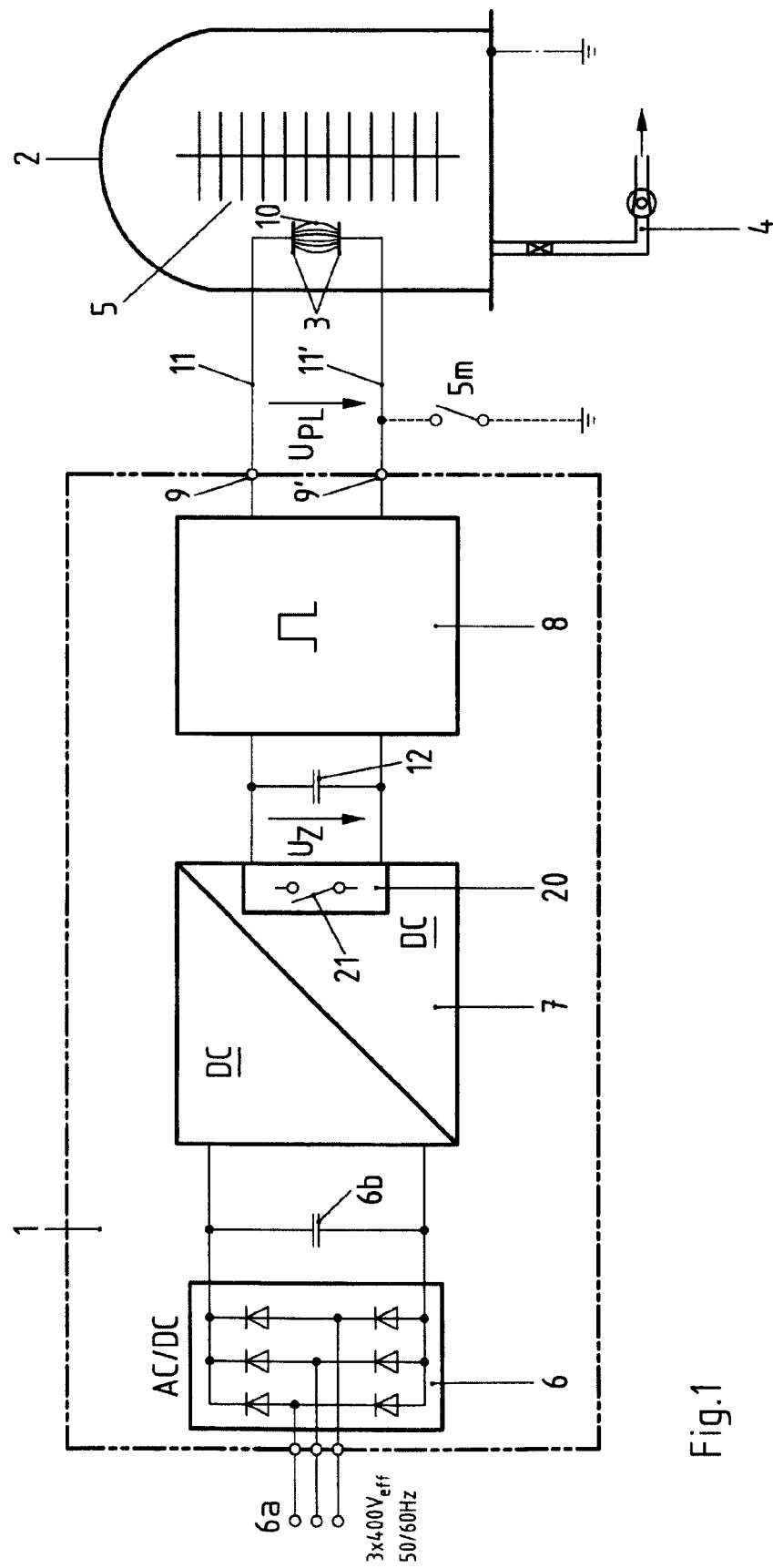
FIG. 1 a block diagram of a vacuum plasma generator according to the invention.

The generator according to the present invention comprises a two-stage topology as shown schematically in FIG. 1. At an AC voltage mains connection 6a, for example, a three-phase voltage of $3 \times 400 V_{eff} 50/60$ Hz is obtained, which is converted in the mains rectifier configuration 6 into a DC voltage and is smoothed with the smoothing capacitor 6b. The DC voltage thus generated is supplied to a first stage, which is implemented as a DC-DC voltage converter 7, for the generation of an intermediate circuit voltage $U_Z$, which is smoothed with an intermediate circuit capacitor 12 or several intermediate circuit capacitors 12'-12'''. The DC-DC voltage converter 7 has the task of providing as large a DC voltage range as possible as feed to the downstream second stage, the pulse output stage 8. The pulse output stage 8 can hereby again provide a large pulse voltage range, and consequently a large load impedance range, at output terminals 9, 9' of the generator 1 for feeding the plasma gap 10 with the plasma voltage $U_{P1}$ between the electrodes 3. The electrodes 3 are disposed in a vacuum chamber 2, or process chamber 2, to be able to treat workpieces 5, or substrates 5, in this process chamber. The vacuum chamber 2 is evacuated in conventional manner via a vacuum pump system 4 and the process gas, such as for example argon and in particular additional desired reactive gases are introduced into the vacuum chamber, such that the plasma discharges can be operated in a pressure range from $5 \times 10^{-4}$ mbar to 10 mbar. The electrodes 3 are connected to the outputs 9, 9' of the generator 1 with electrical lines 11, 11' for the operation of the generator. The plasma gap 10 can be operated floatingly, however, if desired, it can also be fixed at chassis potential, as is indicated symbolically with the ground switch $S_M$, with which one of the feed lines 11, 11' is connected to ground.

In order to be able to achieve the large operating range of generator 1, apart from the pulse width-controlled DC-DC voltage converter 7, additionally a change-over device 20a, b, c is provided. The DC-DC converter 7 includes for this purpose a switching configuration 7b with at least two transformer secondary circuits 23, which can optionally be connected in series or parallel with the change-over device 20 depending on the connected load. Depending on the number of transformer secondary circuits 23, it becomes thereby possible to double or to multiply the voltage and through the parallel connecting to carry out a voltage range adaptation or a power adaptation. Through this controlled operating point adaptation the generator 1 can operate at any time in the optimal load range, wherewith an optimal and economic power adaptation is possible for the operation of a multiplicity of source modes and plasma modes, such as glow discharge, abnormal glow discharge, spark evaporator or "diffused discharge".

Figure 2:
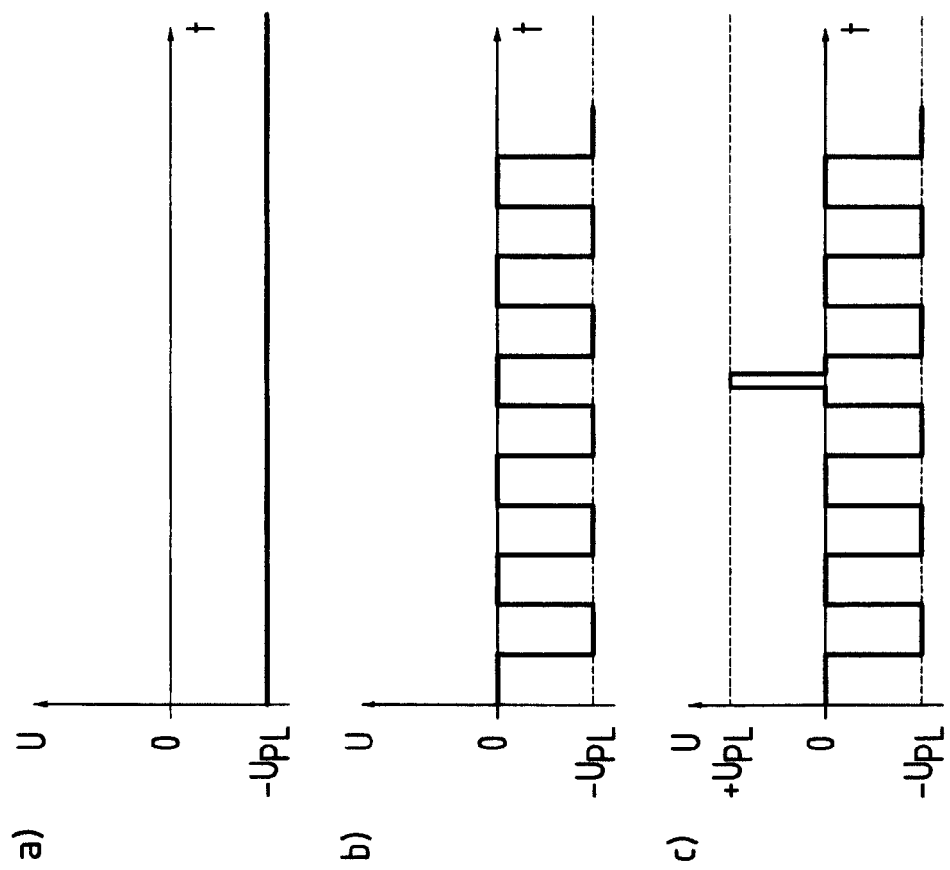
FIG. 2 examples of output voltage forms of the generator according to FIG. 1.

Furthermore, thereby the pulse output stage 8 at outputs 9, 9' can provide the desired pulse form without falsification, as is indicated by example in FIG. 2. For the desired flexible process conduction the pulse output stage 8 can be implemented as a voltage converter with additionally settable pulse width-control for generating pulses of specified pulse amplitude, pulse width and pulse frequency. These values can also be modulated under control.

Depending on the actuation, the two-stage topology according to the invention can, as depicted in FIG. 2a, also make available a pure DC voltage at outputs 9, 9'. However, this topology is especially advantageously applicable for pulse operation, as depicted in FIG. 2b, as unipolar pulse and, in FIG. 2c, as bipolar pulse. The pulse widths and the pulse intervals can herein be set within broad ranges and also do not need to be symmetrical. For example, in FIG. 2c an asymmetric bipolar operation is shown with a narrow positive pulse with very long interval and with several asymmetric negative pulses with shorter intervals. Since the supply also permits the operation between plasma sources or electrodes, such as substrates, of different impedance, an additional asymmetry in the pulse amplitude occurs. This can be affected by way of setting the pulse width.

Figure 3:
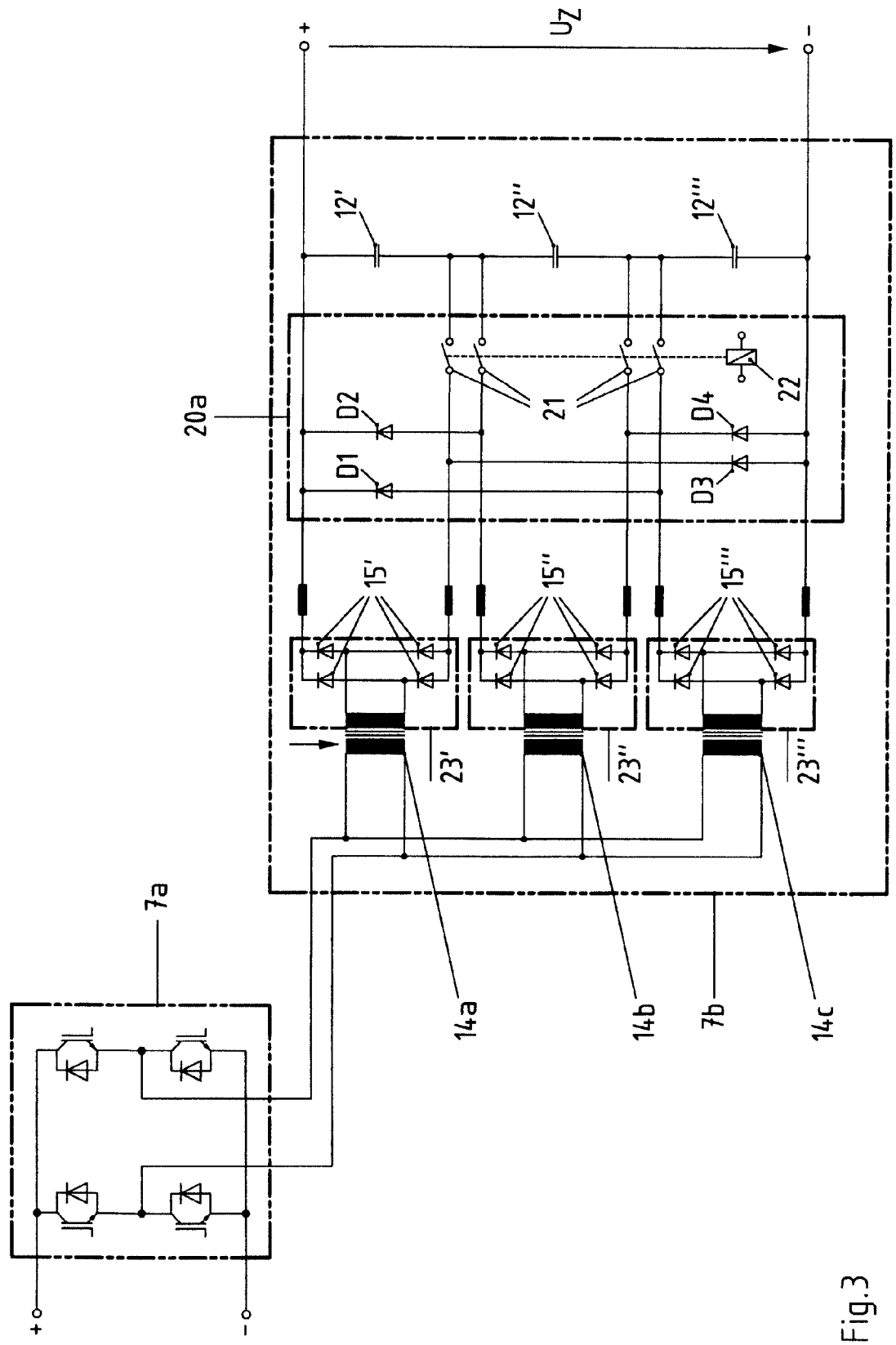
FIG. 3 fundamental diagram of a change-over device for the first stage of the generator, FIG. 4 a variant of a change-over device, FIG. 5a further variant of a change-over device with two floatingly operated converter stages clocked separately, FIG. 5b currents and voltages at phase-offset timing of the converter configuration according to FIG. 5a, FIG. 6a DC-DC converter stage, FIG. 6b traces of voltages and currents at the converter stage according to FIG. 6a at minimal pulse duration, FIG. 7 traces of voltages and currents under periodic duty.

As shown in FIG. 3, the structured generator comprises three transformers 14a to 14c. Any other number greater than one is also conceivable for attaining the advantage. It is also feasible to utilize one transformer with several secondary windings insulated against one another. On the secondary side of the transformer a separate bridge rectifier 15' to 15''' with smoothing inductors is connected downstream as intermediate circuit capacitor 12. Between the rectifiers and a series circuit of intermediate circuit capacitors 12 is located a change-over device 20. In the highest voltage range rectifier 15 feeds a capacitor 12. The switches of the change-over device 20 are closed and the diodes $D_1$-$D_4$ of the change-over device are poled in the reverse direction, due to the potentials at the series-connected capacitors 12, and are consequently currentless. In the lowest voltage range all rectifiers 15 are parallel connected via the change-over device 20. The switches of the change-over device are open and current flow takes place across the diodes D.

FIG. 3 depicts a preferred embodiment of a DC-DC voltage converter 7 implemented as first stage of the generator 1. The DC-DC converter 7 comprises a converter power switch 7a operating as inverter, to which are connected several parallel-connected transformers 14a to 14c. The converter power switch 7a is implemented, for example, as a bridge circuit or a full bridge and includes with advantage IGBT transistors as electronic switching elements. The secondary windings of the transformers 14a to 14c are connected with rectifiers 15, 15'-15''' and form floating transformer secondary circuits 23 insulated against one another. The DC-DC voltage converter 7, as is depicted by example in FIG. 3, here comprises three floating transformer secondary circuits 23. Depending on the desired voltage range, only two floating circuits or several floating circuits can also be utilized. The transformer secondary circuits 23 are so connected to a change-over device 20a that the floating transformer secondary circuits 23 can optionally be connected in series or parallel, whereby at the intermediate circuit capacitors 12' to 12''' series connected in the output range a correspondingly multiplied intermediate circuit voltage $U_z$ occurs. An advantageous implementation of the change-over device 20a comprises that one DC voltage pole of each of the transformer secondary circuits 23 is connected with diodes D1 to D4 and the other DC voltage pole with active switching elements 21. The active switching elements can be implemented as mechanical switches or, if it is necessary to switch very fast, also as electronic switches which are switched under control through a switch control 22 according to the requirements in the suitable process state. The configuration 7b with converter transformers 14, rectifiers 15 and voltage change-over switch 20, consequently, permits a considerable expansion of the setting range of the intermediate circuit voltage $U_z$.

Figure 5A:
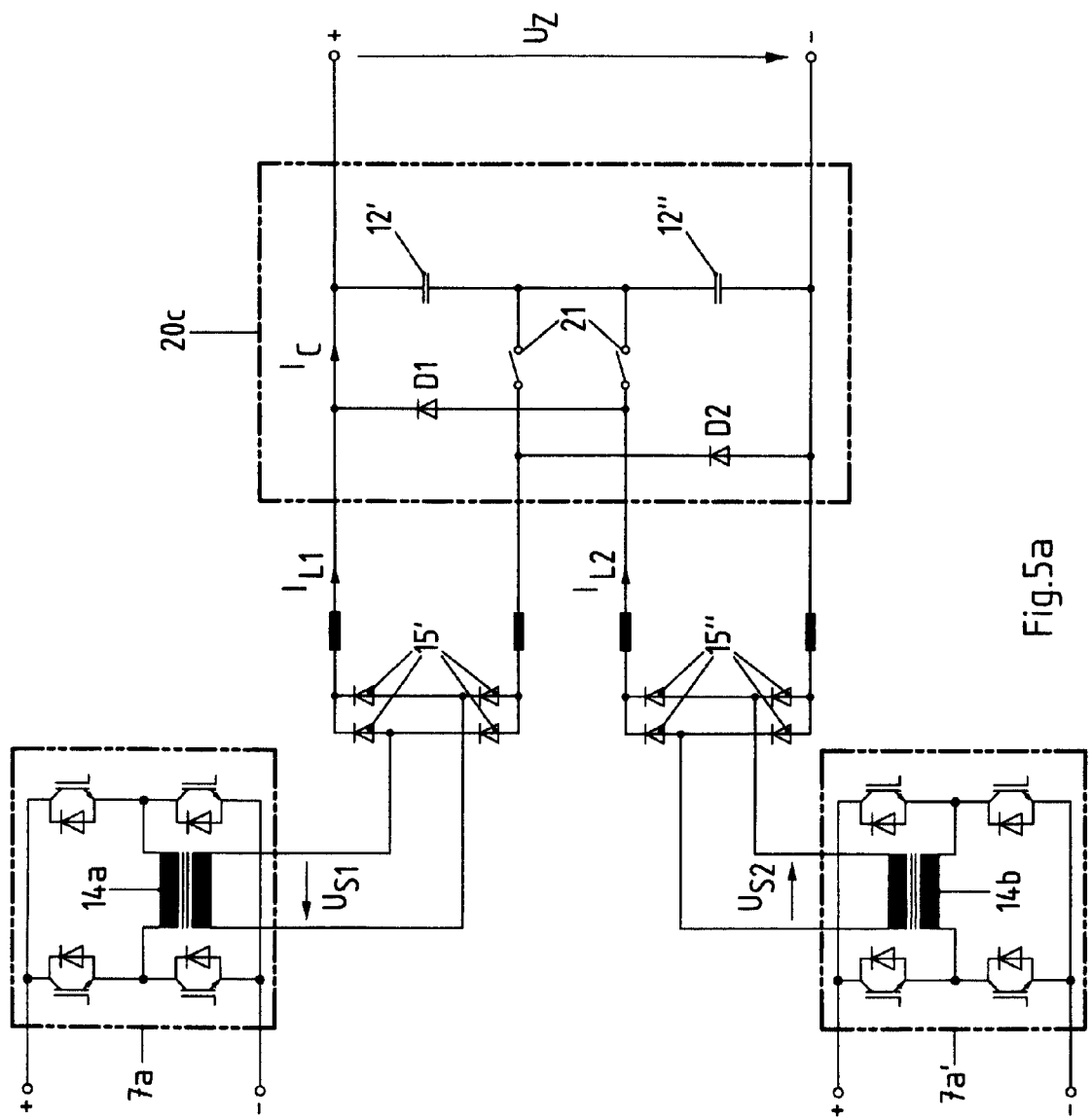
Figure 5B:
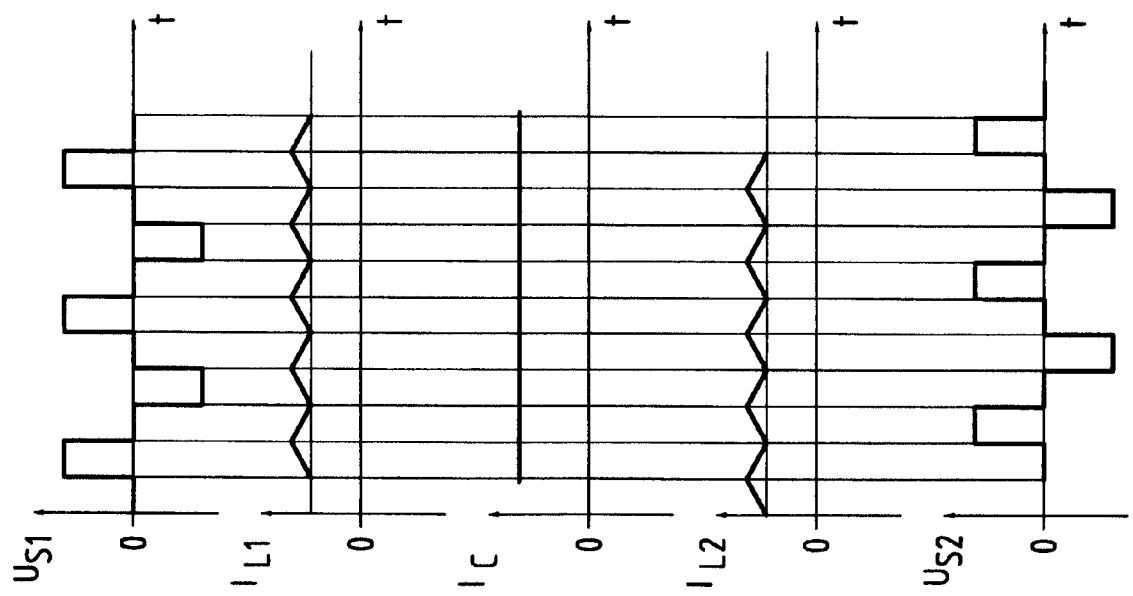

With such a vacuum plasma generator 1 nominal powers up to 100 kW and more can readily be realized. Through a configuration with several full bridge converters, as shown in FIG. 5, the nominal power can be raised, for example, to 400 kW. FIG. 5a shows a DC-DC converter 7 with two independent full bridge circuits forming two floating transformer secondary circuits 23 with the associated change-over device 20c for the expansion of the operating voltage range. To decrease the current loading of the intermediate circuit capacitors 12', 12'', the inverters with transformers 14a, 14b can also be clocked offset in phase, whereby the ripple of the intermediate circuit voltage is also kept lower, as is shown in FIG. 5b with the corresponding currents and voltages. $U_{S1}$, and $U_{S2}$ indicate here the voltage values at the secondary windings of transformers 14 measured over time t. $I_{L1}$ and $I_{L2}$ are the charging currents for the two intermediate circuit capacitors 12', 12'', where $I_C$ represents the total charging current.

Figure 4:
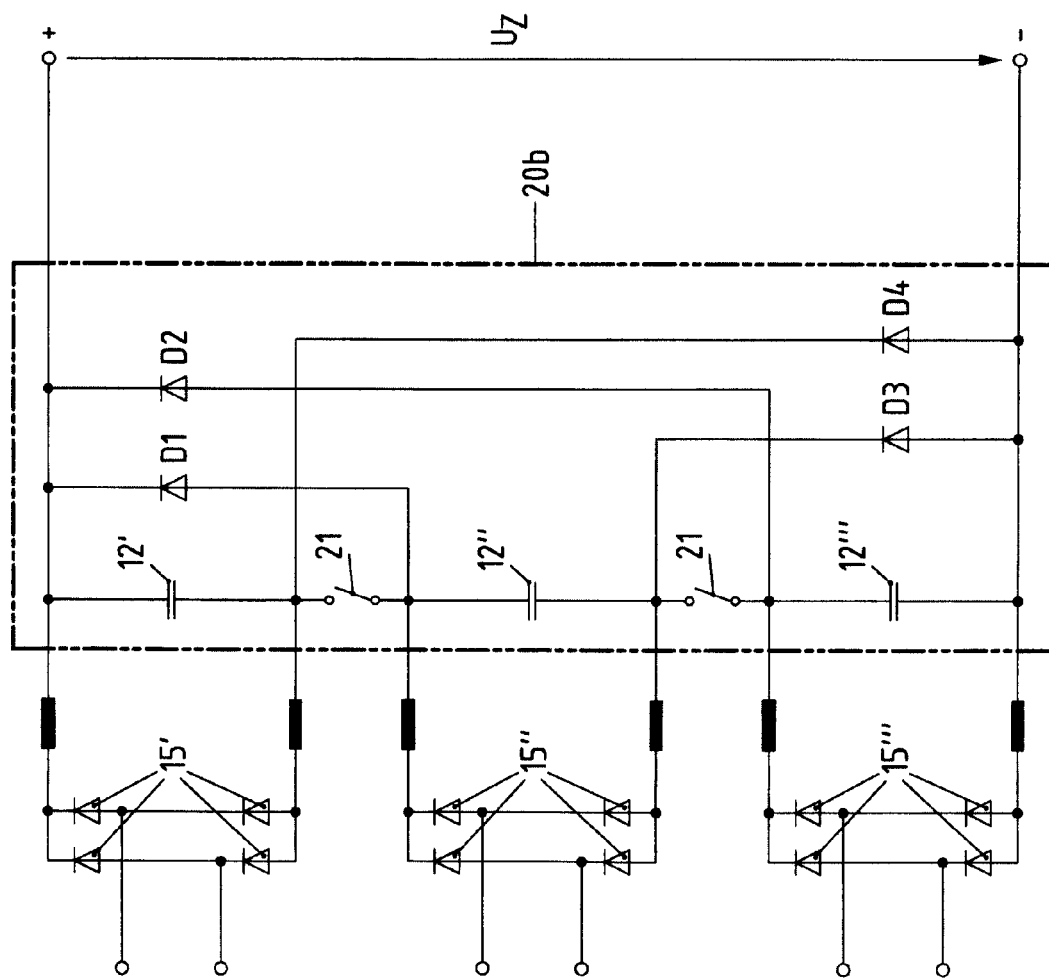

A further feasibility for embodiment is shown in FIG. 4. The change-over device 20b is here not connected between the rectifiers 15' to 15''' and the intermediate circuit capacitors 12' to 12''', but rather switches the configuration of capacitors 12 from a series connection in the high voltage range into a parallel connection in the low voltage range. For the current loading of capacitors 12 this variant is advantageous since the current loading remains unchanged for both voltage ranges. Compared to the solution depicted in FIG. 3, the disadvantage results that the switch 21 in the circuit of capacitors 12 is switched on and therewith the inductance is increased, which is less favorable in particular with a pulsed output voltage.

The principle can be expanded, for example, when using four secondary-side connections with four rectifiers 15, such that three voltage ranges are obtained. In the highest voltage range all rectifiers are quasi series-connected, in the middle voltage range two parallel-connected rectifiers each are series-connected, and the lowest voltage range provides the parallel connection of all rectifiers.

Instead of the depicted diodes D1 to D4, electromechanical switches can also be employed or, if high switching speeds are required, controlled semiconductor switching elements can also be used.

Figure 6A:
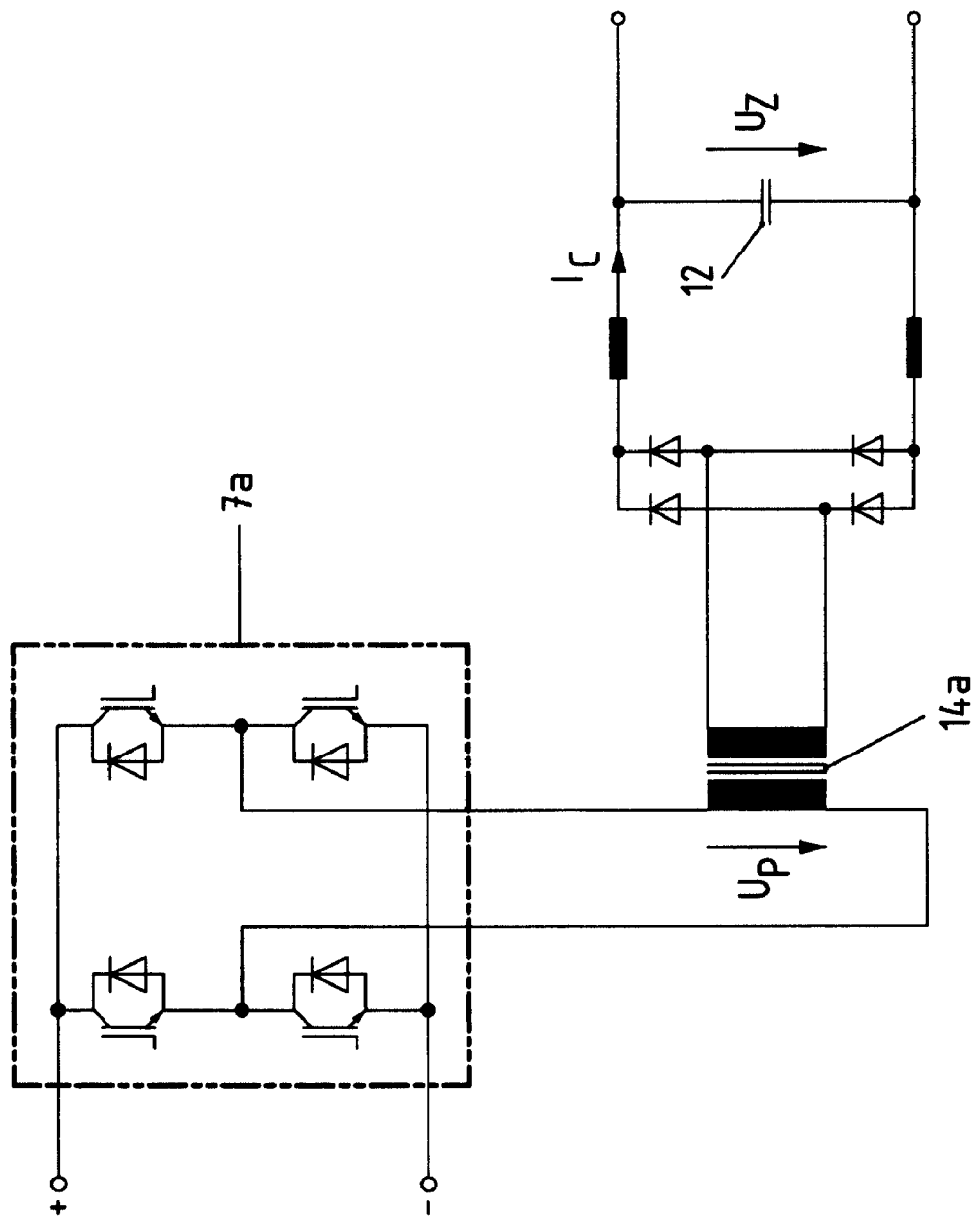
Figure 6B:
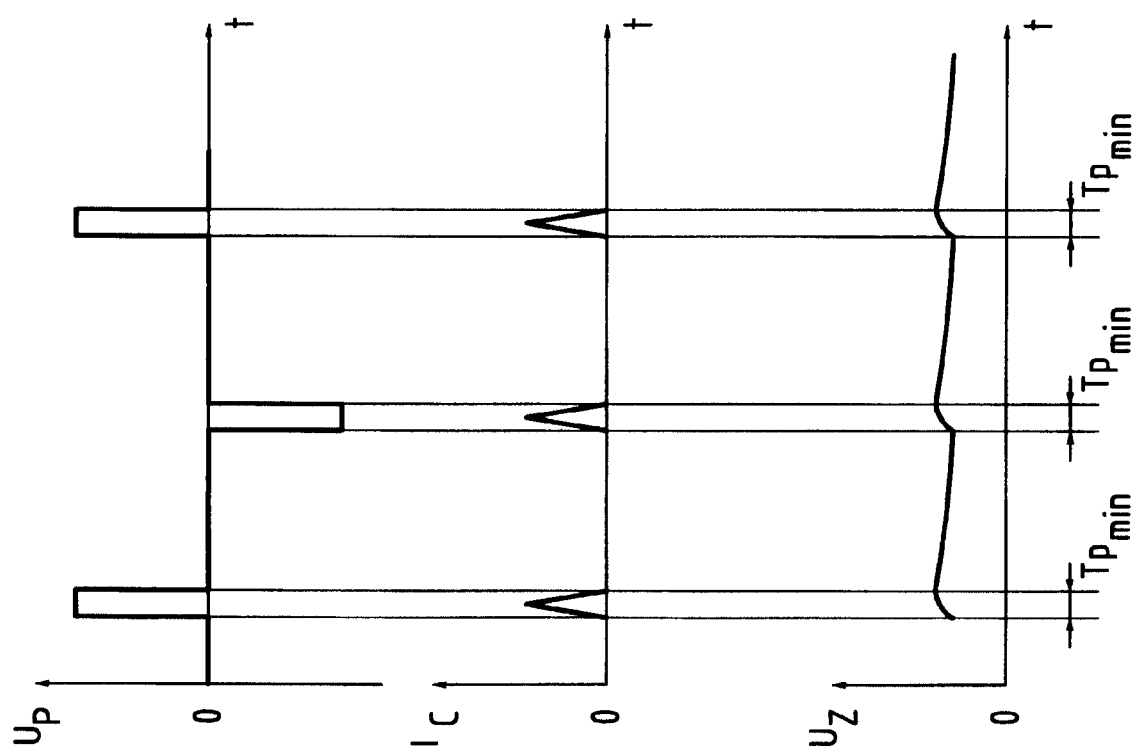
Figure 7:
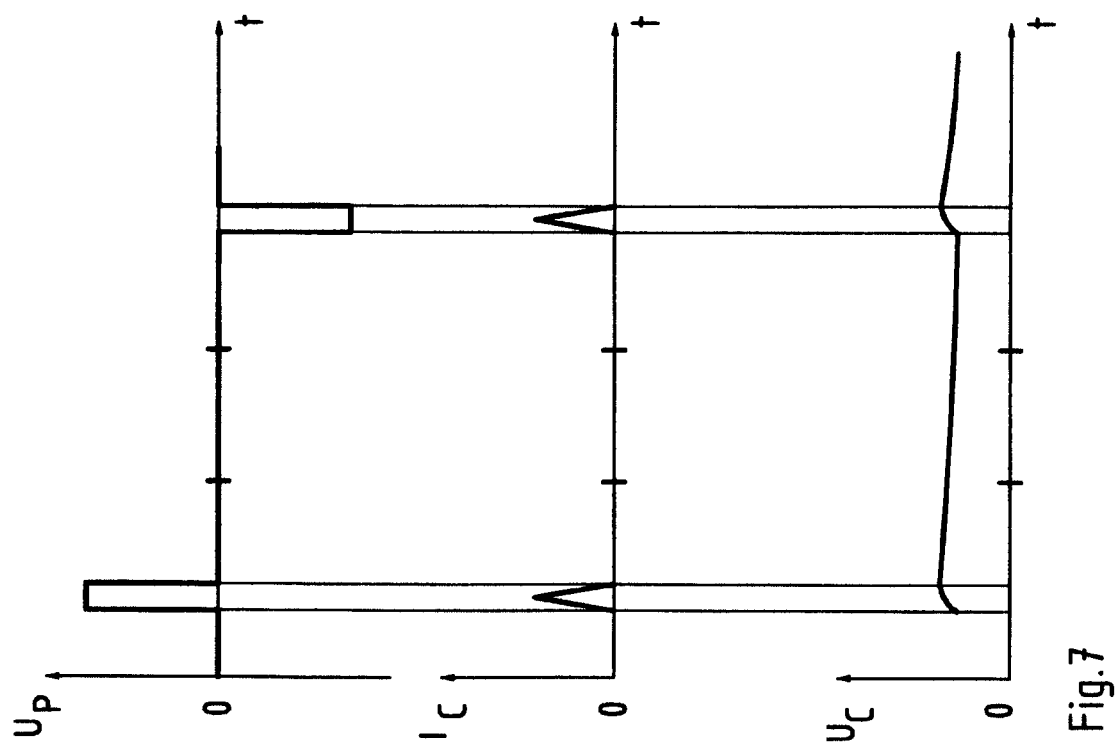

Due to the delay times when the semiconductor switching elements are switched on and off, the minimal pulse duration $t_{Pmin}$, in which the semiconductor switches are switched on, is limited. Thus, it is not possible to generate any arbitrarily short pulses. This applies in particular for IGBT power switching elements employed in the higher power range. The consequence is that the minimal charge with which the capacitors 12 of the DC-DC converter output are recharged during one clock period is limited downwardly, as is shown according to the fundamental circuit diagram according to FIG. 6a and the voltage and current traces according to FIG. 6b. At low output voltages the DC-DC converter must therefore be operated in so-called periodic duty. That means that the converter in some periods is not active and the output capacitors 12 are therefore not recharged during these periods, as is shown in FIG. 7. $U_p$ shows the trace of the bipolar pulse voltage at the primary side of the transformer 14a and $I_c$ the charging current of the intermediate circuit capacitor 12 and $U_z$ the intermediate circuit voltage at capacitor 12. $t_{pmin}$ denotes the minimally possible pulse width.

The vacuum plasma generator 1 according to the invention permits feeding a multiplicity of plasma modes in pulse operation, such as glow discharge, abnormal glow discharge, spark evaporation, or arc evaporation, or "diffused discharge". It is herein possible to cover a large voltage range and impedance range for the different type of load. A preferred range is 0 V to 800 V pulse voltage, which permits covering the mode spark evaporation with an impedance range of 0.05 Ohm to 1.0 Ohm and the mode "diffused discharge" in an impedance range from 0.2 Ohm to 3 Ohm. It is also possible to expand the operating range even more, if necessary, for example to the impedance range of 10 Ohm to 100 Ohm, which encompasses glow discharges and sputter applications. It is also possible to include additionally the impedance range from 50 Ohm to 500 Ohm, which encompasses the abnormal glow discharge at high voltages or also, additionally, to expand from 50 Ohm to 5000 Ohm with yet higher voltage values for the plasma discharge. All of these impedance ranges can be covered singly or combined with one another, depending on requirement and layout of the generator 1, with the change-over device 20.

With such a generator with one change-over device at the generator output it is now also possible to operate optionally two plasma sources, even with different impedances, optionally in the same installation. To increase the efficiency of the process installation further, advantageously with a suitable change-over device even several plasma sources with different impedances can be operated which, in this case, preferably sequentially, are connected according to specifiable, also automatable, progression with the same power supply. Depending on the operating point setting of the single source or the type of connected source, a different load impedance is applied to the generator, which can be handled with the present generator in wide ranges. If, for example, the bipolar pulse lengths are different and the voltage pulse amplitudes accordingly adjust to the currently connected load impedance, it is advantageous if the pulse widths can be varied in order to be able to compensate this behavior as a function of the capability of the line output of the generator. The variation of the load conditions in bipolar operation can even occur differently in the positive as well as also in the negative pulse branch. The generator according to the invention now permits overall an impedance-checked operation over wide ranges, also checked under control according to nominal specifications.

In such plasma processes it is often desirable to superimpose a pulse voltage onto a DC-operated plasma discharge. In order to make this possible, an electric decoupling of the apparatus is necessary. This is made possible thereby that the generator output (9, 9') is connected to a filter, which preferably includes diodes which electrically decouple the two power supplies.

The generator configuration 1 permits providing stable pulse forms and in particular pulses with high edge steepness. For said plasma processes it is especially advantageous if the generator provides an edge steepness steeper than 0.1 V/ns, preferably steeper than 1.0 V/ns. An especially important operating mode is the optional use of spark evaporators and/or the operation of a plasma gap 10 on workpiece 5 in so-called bias operation. Especially in the deposition of insulating layers it is advantageous if bipolar pulses with unequal pulse lengths can be utilized. Due to the mobility of the electrons, which, in comparison to the ions, is higher, small positive pulse lengths are already sufficient to discharge positive charges raised with the ions during the layer growth. The time necessary for the discharge depends on the electron density of the particular plasma. In most cases positive pulse lengths of 10% or less, compared with the negative pulse lengths, are sufficient. It is advantageous to use positive pulse lengths of less than 5%, preferably even less than 2%, of the negative pulse duration. The operating manner in which the pulse length is shorter than one half of the period duration of the operating frequency is also referred to as time gapped operation. With such a generator pulse packets can also be generated under control in order to realize a specifically dosed energy introduction into the plasma.

The invention claimed is:

1. Vacuum plasma generator with a generator output (9, 9') for feeding a plasma discharge (10) for the treatment of workpieces (5) in a vacuum chamber (2) with an AC voltage mains connection (6a), a mains rectifier configuration (6) for the conversion of the mains AC voltage into a DC voltage, a smoothing capacitor (6b), a first stage as a clocked DC/DC voltage converter (7) with means for setting the DC output voltage which forms an intermediate circuit voltage ($U_z$), comprising a controlled power switch (7a) which feeds the primary winding of a transformer (14) and whose secondary winding is connected to a rectifier (15) and a downstream intermediate circuit capacitor (12) and forms a floating transformer secondary circuit (23), wherein this circuit is connected with a downstream second stage which forms a pulse output stage (8) and this output stage is connected to the generator output (9, 9'), characterized in that the DC-DC voltage converter (7) comprises at least two floating transformer secondary circuits (23) and includes a change-over device (20) with a switch control (22) for the optional parallel or serial connection of the floating transformer secondary circuits (23).

2. Generator as claimed in claim 1, characterized in that as means for setting the intermediate circuit voltage ($U_z$) the power switch (7) is pulse-width controlled and that with the switchable transformer secondary circuits (23) the intermediate circuit voltage is additionally doubled or multiplied in steps as required for the expansion of the voltage setting range of the DC/DC converter.

3. Generator as claimed in claim 1, characterized in that the change-over device (20) includes switching diodes (D) and controlled switches (21).

4. Generator as claimed in claim 1, characterized in that the change-over device (20) includes controlled electronic switches (21), preferably mechanical switches (21).

5. Generator as claimed in claim 1, characterized in that three transformer secondary circuits (23) are provided with change-over devices (20).

6. Generator as claimed in claim 1, characterized in that the pulse output stage (8) is implemented as a voltage converter with additionally settable pulse width control for the generation of pulses with specified pulse amplitude, pulse width and pulse frequency.

7. Generator as claimed in claim 1, characterized in that the voltage converter (7) and/or the pulse output stage (8) can be operated with time gapped pulses.

8. Generator as claimed in claim 1, characterized in that the configuration at the output terminals of the generator (9) covers several plasma impedance ranges for feeding a multiplicity of plasma modes, such as glow discharge, abnormal glow discharge, spark evaporation or "diffused discharge".

9. Generator as claimed in claim 8, characterized in that the plasma impedance ranges include 0.05 Ohm to 1.0 Ohm and 0.2 Ohm to 3.0 Ohm.

10. Generator as claimed in claim 9, characterized in that the plasma impedance ranges include additionally 10 Ohm to 100 Ohm.

11. Generator as claimed in claim 8, characterized in that the plasma impedance ranges include additionally 50 Ohm to 500 Ohm.

12. Generator as claimed in claim 8, characterized in that the plasma impedance ranges include additionally 50 Ohm to 5000 Ohm.

13. Generator as claimed in claim 1, characterized in that the configuration at the output terminals of the generator (9) maintains an edge steepness of pulses which is steeper than 0.1 V/ns, preferably steeper than 1.0 V/ns.

14. Generator as claimed in claim 1, characterized in that the generator at the output (9, 9') provides unipolar and/or bipolar pulses.

15. Generator as claimed in claim 14, characterized in that the bipolar pulses have unequal pulse lengths, in particular with the connection to the workpieces (5) for bias operation a negative pulse is longer than a positive pulse, preferably the pulse length of the positive pulse is less than 5%, preferably less than 2%, of the negative pulse duration.

16. Generator as claimed in claim 1, characterized in that the generator output (9, 9') is connected to a change-over device which optionally connects at least two, preferably several, plasma sources (10), preferably sequentially.

17. Generator as claimed in claim 16, characterized in that the generator with the change-over device connects plasma sources (10) with different plasma impedances.

18. Generator as claimed in claim 1, characterized in that the generator output (9, 9') is connected to a filter, preferably comprising diodes, for the electrical decoupling of the generator (1) from a connected superimposed DC feed.

19. Generator as claimed in claim 14, characterized in that the bipolar pulse lengths are different and that the voltage pulse amplitudes of the generator output adjust accordingly to a connected load impedance and that the pulse widths of the generator output can be varied.

\* \* \* \* \*